United States Patent
Li et al.

(10) Patent No.: US 12,197,081 B1
(45) Date of Patent: Jan. 14, 2025

(54) LIGHT-EMITTING MODULE AND FRONT-LIT LIQUID-CRYSTAL-ON-SILICON MODULE

(71) Applicant: Himax Display, Inc., Tainan (TW)

(72) Inventors: Yuet-Wing Li, Tainan (TW); Chi-Wen Lin, Tainan (TW); Chien-Tang Wang, Tainan (TW)

(73) Assignee: Himax Display, Inc., Tainan (TW)

( * ) Notice: Subject to any disclaimer, the term of this patent is extended or adjusted under 35 U.S.C. 154(b) by 0 days.

(21) Appl. No.: 18/480,524

(22) Filed: Oct. 4, 2023

(51) Int. Cl.
| | |
|---|---|
| *G02F 1/1335* | (2006.01) |
| *F21V 8/00* | (2006.01) |
| *H01L 25/075* | (2006.01) |
| *H01L 33/52* | (2010.01) |
| *H01L 33/60* | (2010.01) |

(52) U.S. Cl.
CPC ..... *G02F 1/133616* (2021.01); *G02B 6/0068* (2013.01); *G02B 6/0073* (2013.01); *H01L 25/0753* (2013.01); *H01L 33/52* (2013.01); *H01L 33/60* (2013.01)

(58) Field of Classification Search
CPC ............ G02F 1/133616; G02B 6/0068; G02B 6/0073; H01L 25/0753; H01L 33/52; H01L 33/60
See application file for complete search history.

(56) References Cited

U.S. PATENT DOCUMENTS

| | | | |
|---|---|---|---|
| 2011/0057226 | A1 | 3/2011 | Oberleither et al. |
| 2015/0003035 | A1 | 1/2015 | Li et al. |
| 2015/0171484 | A1 | 6/2015 | Lenardic et al. |
| 2015/0249193 | A1 | 9/2015 | Hong et al. |
| 2019/0378452 | A1* | 12/2019 | Lin ............ G09G 3/2003 |

FOREIGN PATENT DOCUMENTS

| | | |
|---|---|---|
| CN | 105870294 | 3/2019 |
| JP | H11170605 | 6/1999 |
| JP | 2005227339 | 8/2005 |
| JP | 2009218274 | 9/2009 |
| JP | 2012099544 | 5/2012 |
| JP | 2014082525 | 5/2014 |
| JP | 2015148793 | 8/2015 |
| JP | 2019186300 | 10/2019 |
| WO | 2009069671 | 6/2009 |
| WO | 2023127897 | 7/2023 |

OTHER PUBLICATIONS

Machine translation of WO2023127897A1 (Year: 2023).*
"Office Action of Taiwan Counterpart Application", issued on Jun. 20, 2024, p. 1-p. 5.
"Office Action of Japan Counterpart Application", issued on Apr. 1, 2024, p. 1-p. 5.
"Search Report of Europe Counterpart Application", issued on Apr. 25, 2024, p. 1-p. 5.

* cited by examiner

*Primary Examiner* — Anne M Hines
*Assistant Examiner* — Jose M Diaz
(74) *Attorney, Agent, or Firm* — JCIPRNET

(57) ABSTRACT

A light-emitting module including a substrate, a plurality of light-emitting elements, a window plate, and an encapsulant is provided. The light-emitting elements are disposed on the substrate and have a plurality of light colors. The window plate is disposed on light-emitting surfaces of the light emitting elements. The encapsulant wraps the light-emitting elements and surrounds the window plate. A front-lit liquid-crystal-on-silicon module is also provided.

19 Claims, 12 Drawing Sheets

LIGHT-EMITTING MODULE AND FRONT-LIT LIQUID-CRYSTAL-ON-SILICON MODULE

BACKGROUND

Technical Field

The invention generally relates to an optical module and, in particular, to a light-emitting module and a front-lit liquid-crystal-on-silicon (LCOS) module.

Description of Related Art

With the advancement of display technology, a light valve is created to convert an illumination beam from a light source into an image beam. A projection lens is disposed on a path of the image beam and configured to project the image onto a screen, so as to form an image on the screen. Therefore, a user can see the image on the screen. Generally, the light valve is classified into an LCOS panel and a digital micro-mirror device (DMD).

Some conventional LCOS panels have color filters, so that the LCOS panel may provide color images. For example, a color filter let a pixel be divided into a red subpixel, a green subpixel, and a blue subpixel. However, the subpixels reduce the resolution of the LCOS panel. If an LCOS has pixels which are not divided onto subpixel with different colors, the LCOS may have higher resolution, but the LCOS needs a color light source to illuminate it. However, there is no color light source providing illumination with enough power in a conventional LCOS module.

SUMMARY

Accordingly, the invention is directed to a light-emitting module, which can provide color illumination with enough power.

The invention is directed to a front-lit LCOS module, which can provide a color image beam with enough intensity.

An embodiment of the invention provides a light-emitting module including a substrate, a plurality of light-emitting elements, a window plate, and an encapsulant. The light-emitting elements are disposed on the substrate and have a plurality of light colors. The window plate is disposed on light-emitting surfaces of the light emitting elements. The encapsulant wraps the light-emitting elements and surrounds the window plate.

An embodiment of the invention provides a front-lit liquid-crystal-on-silicon (LCOS) module including the aforementioned light-emitting module, a first polarizer, a waveguide, an LCOS panel, and a second polarizer. Lights emitted by the light-emitting elements pass through the window plate to form an illumination beam. The first polarizer is disposed on a path of the illumination beam and configured to polarize the illumination beam. The waveguide has a first surface, a second surface opposite to the first surface, and a light incident surface connecting the first surface with the second surface, wherein the illumination beam from the first polarizer enters the waveguide through the light incident surface. The LCOS panel is disposed below the second surface and configured to convert the illumination beam into a polarized image beam. The second polarizer is disposed on the first surface and configured to allow the polarized image beam to pass through, wherein the polarized image beam from the LCOS panel passes through the second surface, the first surface, and the second polarizer in sequence.

In the light-emitting module and the front-lit LCOS module according to the embodiment of the invention, a plurality of light-emitting elements having a plurality of light colors are adopted to provide lights with different colors, and a window plate is adopted to guide the lights out, so that the light-emitting module according to the embodiment of the invention can provide color illumination with enough power. Therefore, the front-lit LCOS module according to the embodiment of the invention can provide a color image beam with enough intensity.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
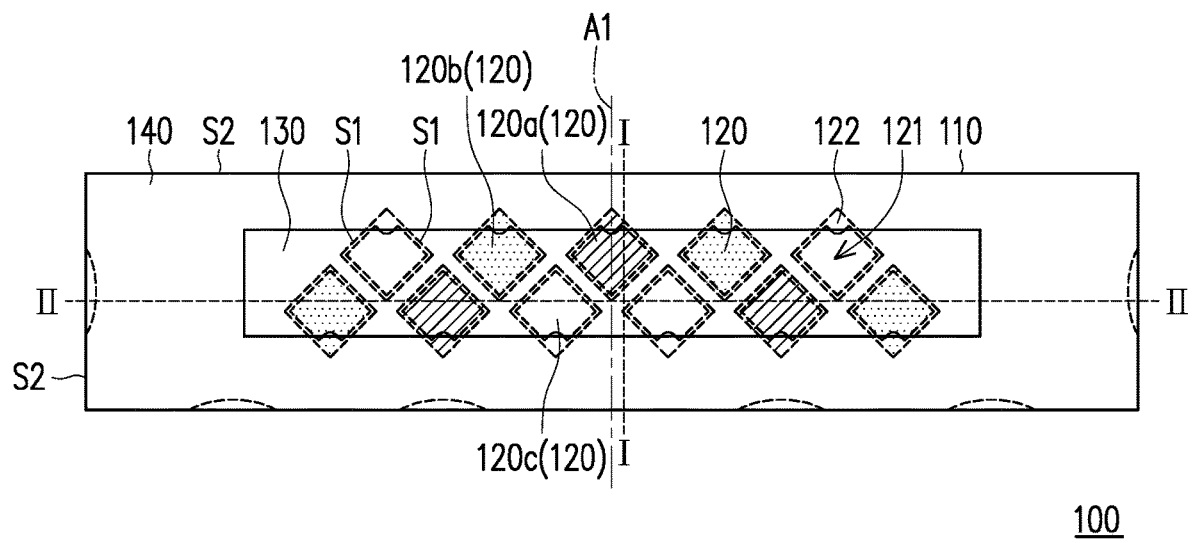
FIG. 1A is a schematic top view of a light-emitting module according to an embodiment of the invention.
Figure 1B:
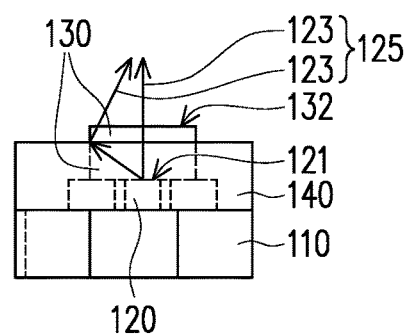
FIG. 1B is a schematic cross-sectional view of the light-emitting module along line I-I in FIG. 1A.
Figure 1C:
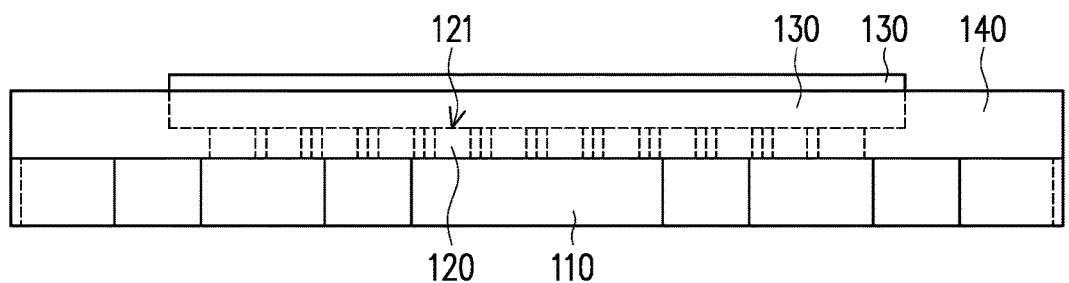
FIG. 1C is a schematic cross-sectional view of the light-emitting module along line II-II in FIG. 1A.
Figure 2:
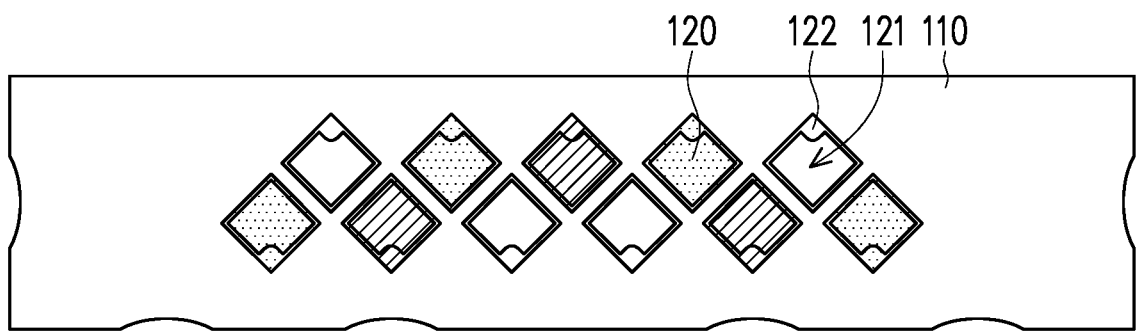
FIG. 2 is a schematic top view of the substrate and the light-emitting elements of the light-emitting module in FIG. 1A.

FIG. 1A is a schematic top view of a light-emitting module according to an embodiment of the invention, FIG. 1B is a schematic cross-sectional view of the light-emitting module along line I-I in FIG. 1A, and FIG. 1C is a schematic cross-sectional view of the light-emitting module along line II-II in FIG. 1A. FIG. 2 is a schematic top view of the substrate and the light-emitting elements of the light-emitting module in FIG. 1A. Referring to FIGS. 1A to 1C and FIG. 2, the light-emitting module 100 in this embodiment includes a substrate 110, a plurality of light-emitting elements 120, a window plate 130, and an encapsulant 140. The light-emitting elements 120 are disposed on the substrate 110 and have a plurality of light colors. In this embodiment, the light-emitting elements 120 include at least one first color light-emitting diode 120a (a plurality of first color light-emitting diodes 120a are exemplarily shown in FIG. 1A), at least one second color light-emitting diode (a plurality of second color light-emitting diodes 120b are exemplarily shown in FIG. 1A), and at least one third light-emitting diode (a plurality of first color light-emitting diodes 120c are exemplarily shown in FIG. 1A).

In this embodiment, one of the first color light-emitting diode 120a, the second color light-emitting diode 120b, and the third color light-emitting diode 120c is a red light-emitting diode, another one of the first color light-emitting diode 120a, the second color light-emitting diode 120b, and the third color light-emitting diode 120c is a green light-emitting diode, and the other one of the first color light-emitting diode 120a, the second color light-emitting diode 120b, and the third color light-emitting diode 120c is a blue light-emitting diode.

Figure 1D:
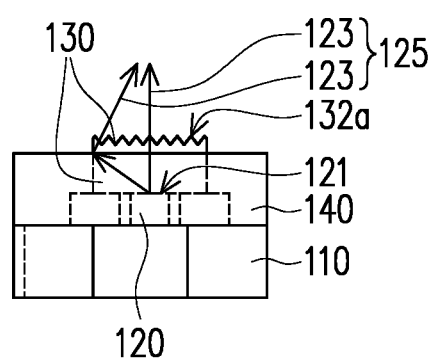
FIG. 1D and FIG. 1E are schematic cross-sectional views of the light-emitting module according to two other embodiments of the invention.
Figure 1E:
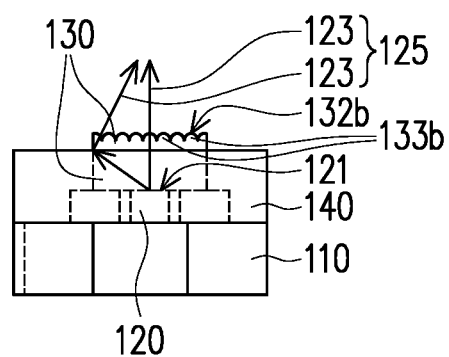

The window plate 130 is disposed on light-emitting surfaces 121 of the light emitting elements 120. The encapsulant 140 wraps the light-emitting elements 120 and surrounds the window plate 130. In this embodiment, the window plate 130 is a transparent plate, and lights 123 emitted by the light-emitting elements 120 pass through the window plate 130 to form an illumination beam 125. In this embodiment, the top surface 132 of the window plate 130 facing away from the light-emitting elements 120 may be a flat surface. However, in other embodiments, the top surface 132a of the window plate 130 facing away from the light-emitting elements 120 may be a random scattering surface (e.g. a rough surface) as shown in FIG. 1D, or the top surface 132b of the window plate 130 facing away from the light-emitting elements 120 may be a surface having microlenses 133b arranged in an array as shown in FIG. 1E. Moreover, the window plate 130 may be made of glass or a plastic material (for example, an acrylic-based plastic material).

In the light-emitting module 100 in this embodiment of the invention, a plurality of light-emitting elements 120 having a plurality of light colors are adopted to provide lights 123 with different colors, and a window plate 130 is adopted to guide the lights 123 out, so that the light-emitting module 100 in this embodiment can provide color illumination with enough power.

In this embodiment, each of the light-emitting elements 120 has a top electrode 122 beside the light-emitting surface 121 thereof and at a top side of the light-emitting element 120 facing away from the substrate 110, and the window plate 130 exposes the top electrode 122. In this embodiment, each of the light-emitting elements 120 also has a bottom electrode at a bottom side of the light-emitting element 120 adjacent to the substrate 110. However, in other embodiments, each of the light-emitting elements 120 may have two top electrodes at the top side of the light-emitting element 120, or each of the light-emitting elements 120 may have two bottom electrodes at the bottom side of the light-emitting element 120. In this embodiment, the top electrode 122 is located at a corner of the light-emitting surface 121, exposed by the window plate 130, and covered by the encapsulant 140. In this embodiment, the encapsulant 140 is, for example, sealing glue. The color of the encapsulant 140 may be black, white, or any other suitable color. The encapsulant 140 may have a diffusive surface and act as a sealant to protect light-emitting diodes and bonding wires of light-emitting diodes.

In this embodiment, the light-emitting elements 120 are symmetrically disposed on the substrate 110 with respect to a line of symmetry A1. In this embodiment, a side S1 of each of the light-emitting elements 120 is not parallel to a side S2 of the substrate 110, and is not perpendicular to the side of the substrate 110. In other words, the side S1 is inclined with respect to the side S2.

Figure 3A:
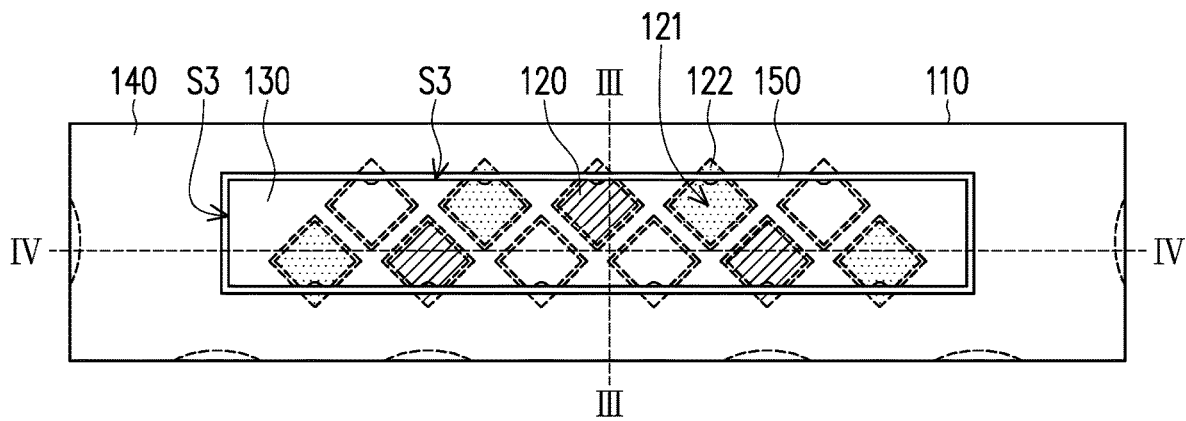
FIG. 3A is a schematic top view of a light-emitting module according to another embodiment of the invention.
Figure 3B:
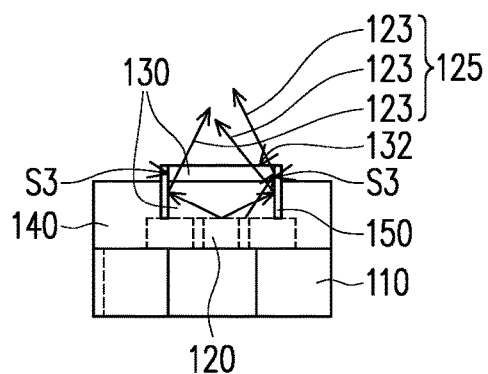
FIG. 3B is a schematic cross-sectional view of the light-emitting module along line III-III in FIG. 3A.
Figure 3C:
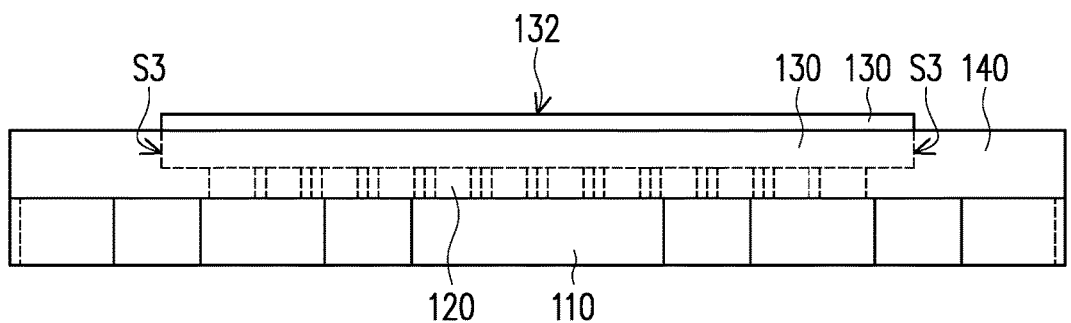
FIG. 3C is a schematic cross-sectional view of the light-emitting module along line IV-IV in FIG. 3A.
Figure 4A:
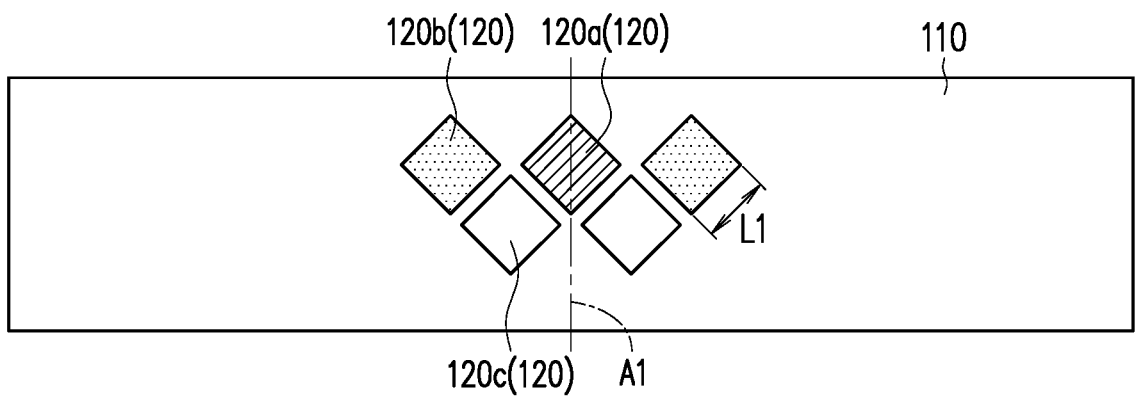
FIGS. 4A to 4D are schematic top views of a substrate and light-emitting elements of a light-emitting module according to other embodiments of the invention.
Figure 4B:
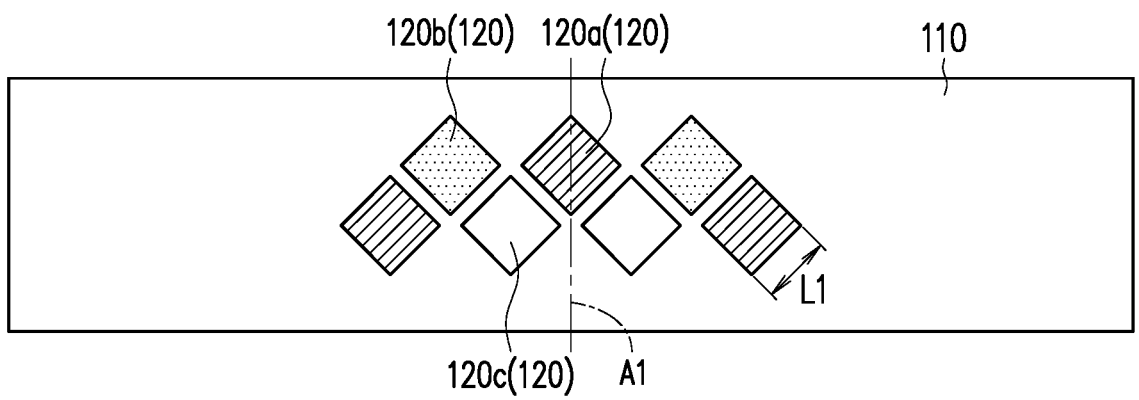
Figure 4C:
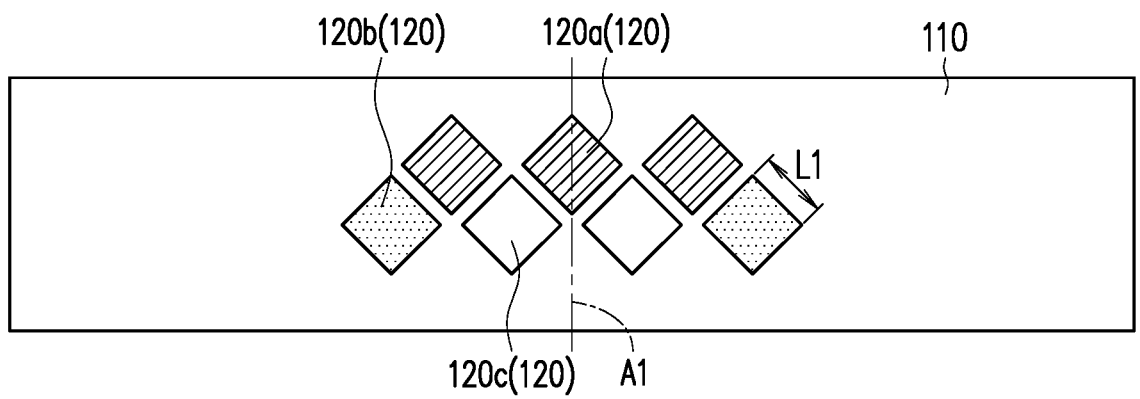
Figure 4D:
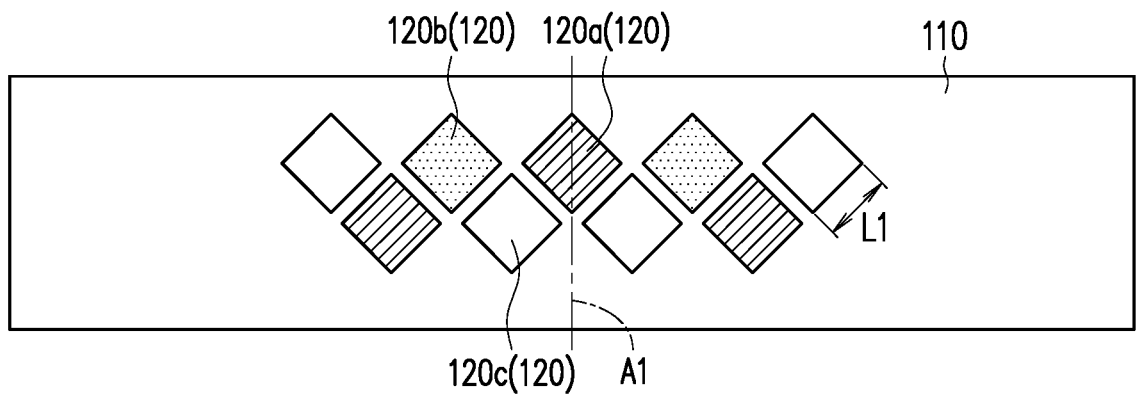
Figure 5A:
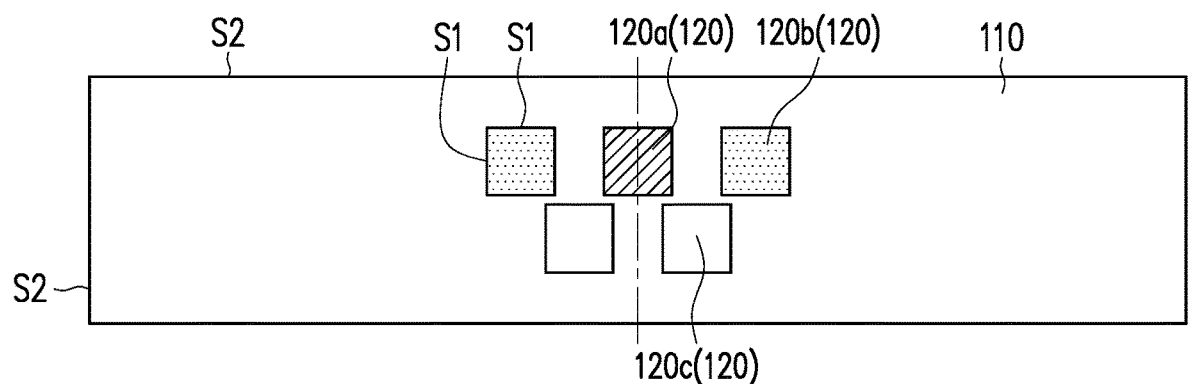
FIGS. 5A to 5E are schematic top views of a substrate and light-emitting elements of a light-emitting module according to other embodiments of the invention.
Figure 5B:
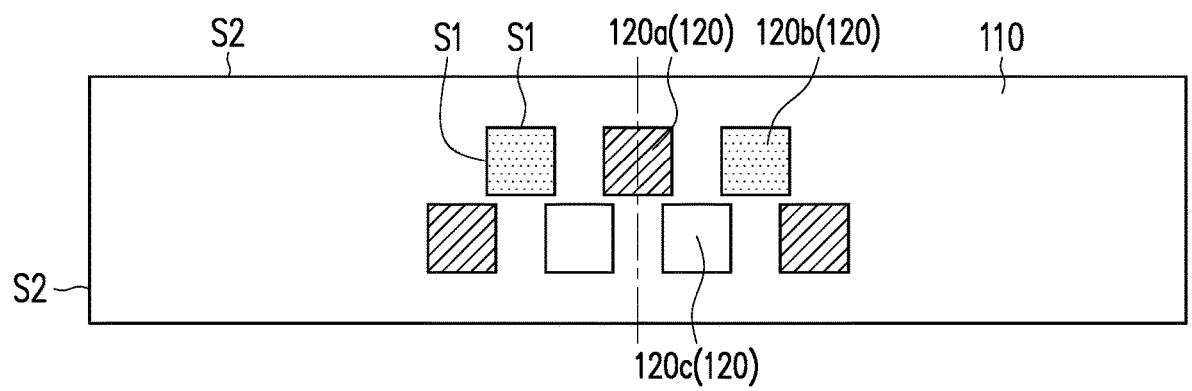
Figure 5C:
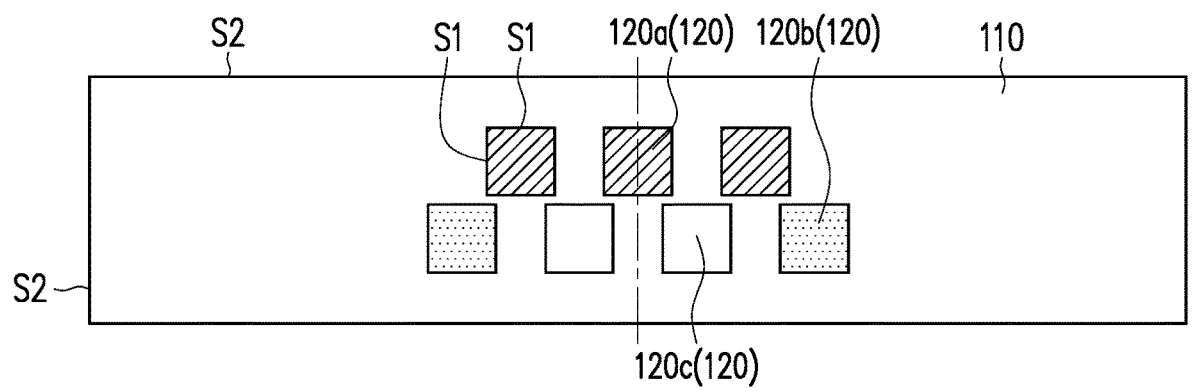
Figure 5D:
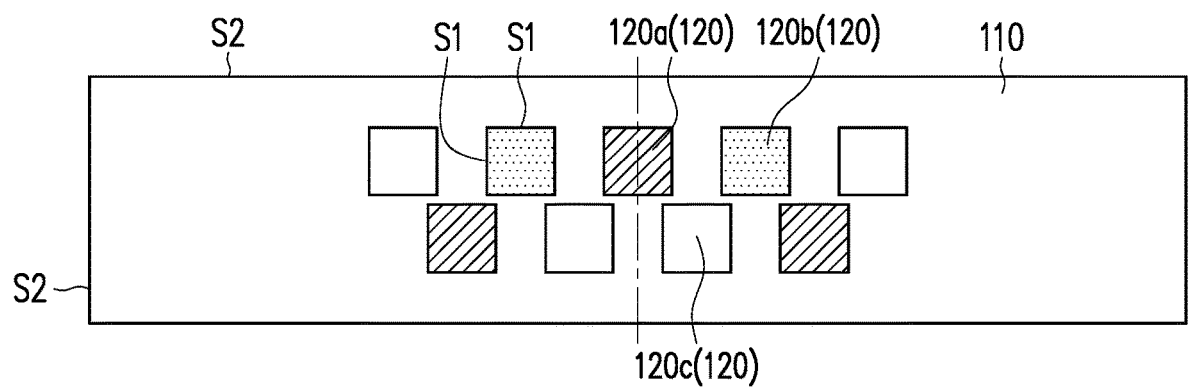
Figure 5E:
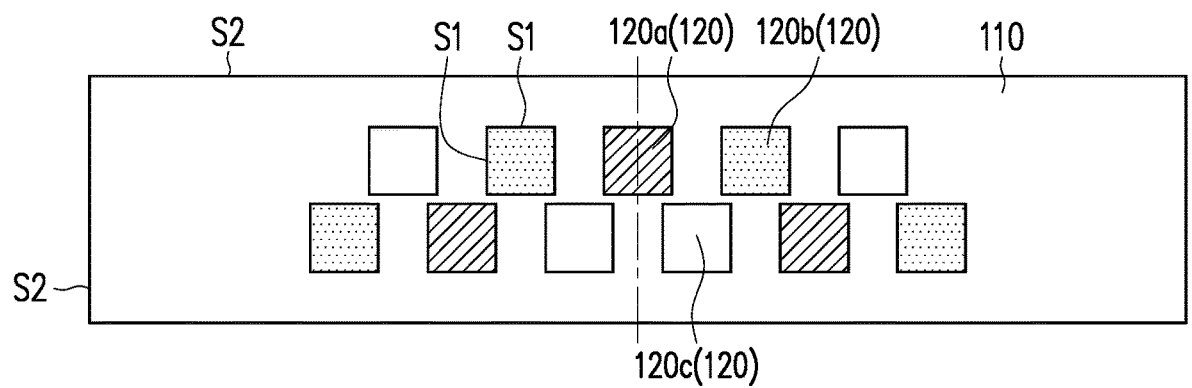

FIG. 3A is a schematic top view of a light-emitting module according to another embodiment of the invention, FIG. 3B is a schematic cross-sectional view of the light-emitting module along line III-III in FIG. 3A, and FIG. 3C is a schematic cross-sectional view of the light-emitting module along line IV-IV in FIG. 3A. Referring to FIGS. 3A to 3C, the light-emitting module 100d in this embodiment is similar to the light-emitting module 100 in FIG. 1A, and the main difference therebetween is as follows. In the light-emitting module 100d in this embodiment, the side surface S3 of the window plate 130 is coated with a reflective film 150. For example, the window plate 130 may have four side surfaces S3 all coated with reflective films 150. The reflective film 150 may well reflect lights 123 emitted from the light-emitting elements 120 in inclined directions to the window plate 130, so that the power of the color illumination provided by the light-emitting module 100d is further increased. The reflective film 150 may prevents the leakage of lights 123 to the encapsulant 140 and help for mixing lights 123 with different colors into a more uniform white light.

FIGS. 4A to 4D are schematic top views of a substrate and light-emitting elements of a light-emitting module according to other embodiments of the invention. Referring to FIGS. 4A to 4D, FIGS. 4A to 4D show different arrangement ways of light-emitting elements 120 disposed on the substrate 110. In FIGS. 4A to 4D, the first light-emitting diodes 120a, the second light-emitting diodes 120b, and the third light-emitting diodes 120c may be alternately arranged in different ways. In an embodiment, the number of the light-emitting elements 120 in the substrate 110 may be 3 to 1000. The side length L1 of each of the light-emitting elements 120 may be 1 micron to 1000 microns.

FIGS. 5A to 5E are schematic top views of a substrate and light-emitting elements of a light-emitting module according to other embodiments of the invention. Referring to FIG. 5A to 5E, in these embodiments, a side S1 of each of the light-emitting elements 120 is parallel or perpendicular to a side S2 of the substrate 110. In these embodiments, the first light-emitting diodes 120a, the second light-emitting diodes 120b, and the third light-emitting diodes 120c may be alternately arranged in different ways.

Figure 6A:
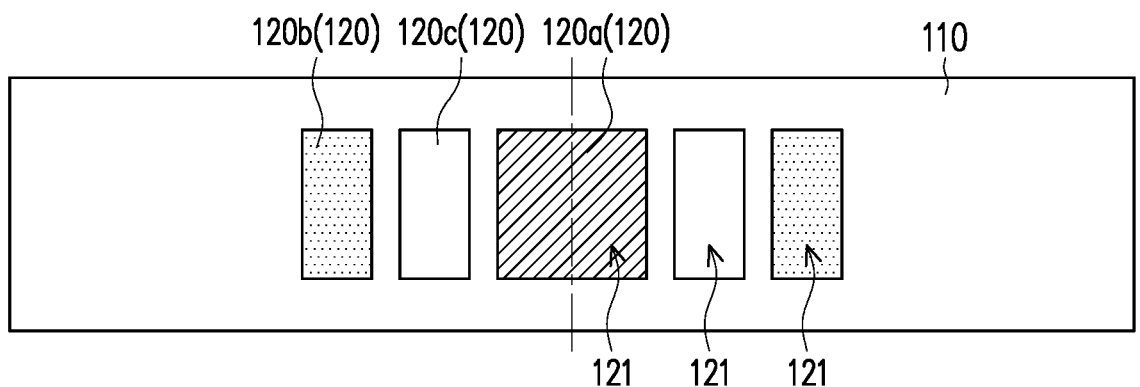
FIGS. 6A to 6C are schematic top views of a substrate and light-emitting elements of a light-emitting module according to other embodiments of the invention.
Figure 6B:
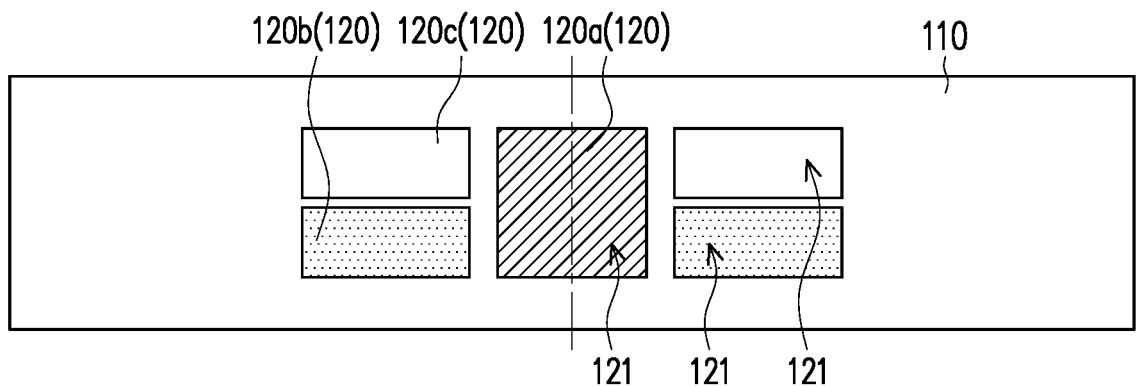
Figure 6C:
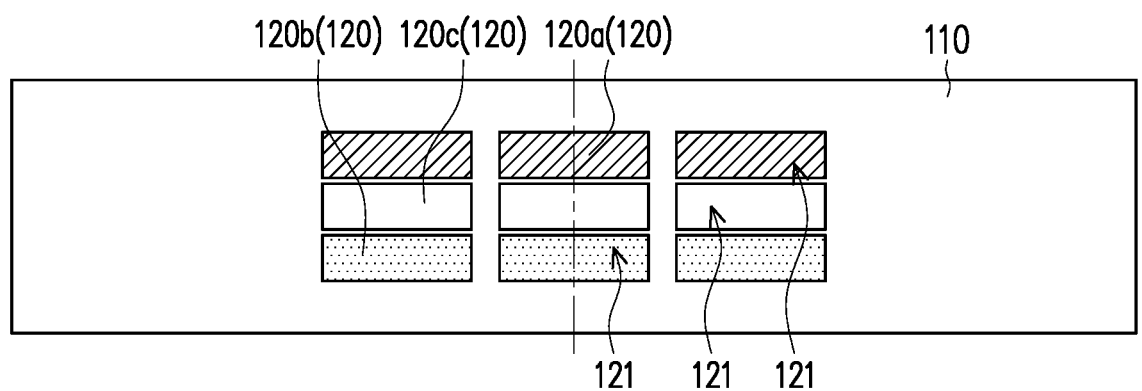

FIGS. 6A to 6C are schematic top views of a substrate and light-emitting elements of a light-emitting module according to other embodiments of the invention. Referring to FIG. 6A and FIG. 6B, in the two embodiments, an area of the light-emitting surface 121 of the first color light-emitting diode 120a is greater than an area of the light-emitting surface 121 of the second color light-emitting diode 120b and greater than an area of the light-emitting surface 121 of the third color light-emitting diode 120c. In FIG. 6C, an area of the light-emitting surface 121 of the first color light-emitting diode 120a is equal to an area of the light-emitting surface 121 of the second color light-emitting diode 120b and equal to an area of the light-emitting surface 121 of the third color light-emitting diode 120c, the light-emitting elements 120 with the same color is arranged in the same row.

Figure 7:
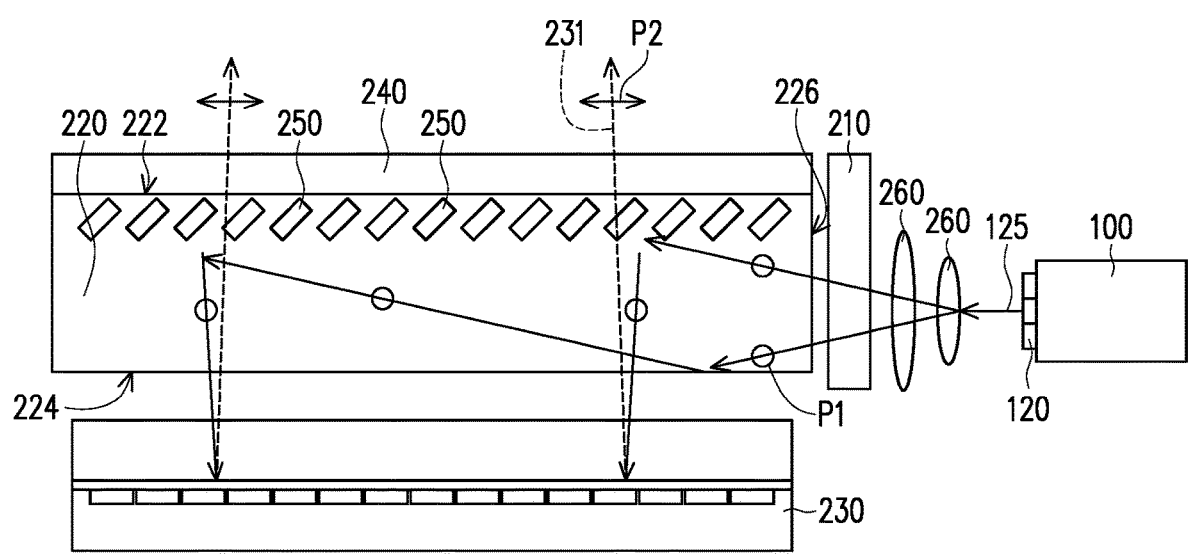
FIG. 7 is a schematic cross-section view of a front-lit LCOS module according to an embodiment of the invention.

FIG. 7 is a schematic cross-section view of a front-lit LCOS module according to an embodiment of the invention.

Referring to FIG. 7, the front-lit LCOS module 200 in this embodiment includes any one of the aforementioned light-emitting modules in various embodiments (the light-emitting module 100 is taken as an example in the following), a first polarizer 210, a waveguide 220, an LCOS panel 230, and a second polarizer 240. The first polarizer 210 is disposed on a path of the illumination beam 125 from the light-emitting module 100 and configured to polarize the illumination beam 125. In an embodiment, the first polarizer 210 is a wire grid polarizer film. The waveguide 220 has a first surface 222, a second surface 224 opposite to the first surface 222, and a light incident surface 226 connecting the first surface 222 with the second surface 224, wherein the illumination beam 125 from the first polarizer 210 enters the waveguide 220 through the light incident surface 226. The LCOS panel 230 is disposed below the second surface 224 and configured to convert the illumination beam 125 into a polarized image beam 231. The second polarizer 240 is disposed on the first surface 222 and configured to allow the polarized image beam 231 to pass through, wherein the polarized image beam 231 from the LCOS panel 230 passes through the second surface 224, the first surface 222, and the second polarizer 240 in sequence. In an embodiment, the illumination beam 125 polarized by the first polarizer 210 has a first polarization direction P1, the polarized image beam 231 has a second polarization direction P2, and the first polarization direction P1 is perpendicular to the second polarization direction P2. Moreover, the second polarizer 240 allows light having the second polarization direction P2 (i.e. the polarized image beam 231) to pass through.

In this embodiment, the front-lit LCOS module 200 in this embodiment further includes a plurality of micro-mirrors 250 disposed along the first surface 222 at intervals and configured to reflect the illumination beam 125 to the LCOS panel 230. In this embodiment, the light-emitting elements 120 having different light colors are configured to emit lights 123 with different colors in turn. For example, a first color light, a second color light and a third color light are emitted in sequence, so that the front-lit LCOS module 200 may be a color sequential front-lit LCOS module. In this embodiment, the front-lit LCOS module 200 may further include at least one coupling lens 260 (two coupling lenses 260 are exemplarily shown in FIG. 7) disposed between the light-emitting module 100 and the first polarizer 210 and configured to couple the illumination beam 125 to the first polarizer 210.

In this embodiment, since the light-emitting module 100 can provide color illumination with enough power, the front-lit LCOS module 200 in this embodiment can provide a color image beam with enough intensity.

In conclusion, in the light-emitting module and the front-lit LCOS module according to the embodiment of the invention, a plurality of light-emitting elements having a plurality of light colors are adopted to provide lights with different colors, and a window plate is adopted to guide the lights out, so that the light-emitting module according to the embodiment of the invention can provide color illumination with enough power. Therefore, the front-lit LCOS module according to the embodiment of the invention can provide a color image beam with enough intensity.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A light-emitting module comprising:
a substrate;
a plurality of light-emitting elements disposed on the substrate and having a plurality of light colors;
a window plate disposed on light-emitting surfaces of the light emitting elements; and
an encapsulant wrapping the light-emitting elements and surrounding the window plate,
wherein each of the light-emitting elements has a top electrode beside the light-emitting surface thereof, and the window plate exposes the top electrode.

2. The light-emitting module according to claim 1, wherein the light-emitting elements include at least one first color light-emitting diode, at least one second color light-emitting diode, and at least one third light-emitting diode.

3. The light-emitting module according to claim 2, wherein an area of the light-emitting surface of the first color light-emitting diode is greater than an area of the light-emitting surface of the second color light-emitting diode and greater than an area of the light-emitting surface of the third color light-emitting diode.

4. The light-emitting module according to claim 2, wherein one of the first color light-emitting diode, the second color light-emitting diode, and the third color light-emitting diode is a red light-emitting diode, another one of the first color light-emitting diode, the second color light-emitting diode, and the third color light-emitting diode is a green light-emitting diode, and the other one of the first color light-emitting diode, the second color light-emitting diode, and the third color light-emitting diode is a blue light-emitting diode.

5. The light-emitting module according to claim 1, wherein a side surface of the window plate is coated with a reflective film.

6. The light-emitting module according to claim 1, wherein the light-emitting elements are symmetrically disposed on the substrate with respect to a line of symmetry.

7. The light-emitting module according to claim 1, wherein a side of each of the light-emitting elements is not parallel to a side of the substrate, and is not perpendicular to the side of the substrate.

8. The light-emitting module according to claim 1, wherein a side of each of the light-emitting elements is parallel or perpendicular to a side of the substrate.

9. A front-lit liquid-crystal-on-silicon (LCOS) module comprising:
a light-emitting module comprising:
a substrate;
a plurality of light-emitting elements disposed on the substrate and having a plurality of light colors;
a window plate disposed on light-emitting surfaces of the light emitting elements, wherein lights emitted by the light-emitting elements pass through the window plate to form an illumination beam; and
an encapsulant wrapping the light-emitting elements and surrounding the window plate;
a first polarizer disposed on a path of the illumination beam and configured to polarize the illumination beam;
a waveguide having a first surface, a second surface opposite to the first surface, and a light incident surface connecting the first surface with the second surface, wherein the illumination beam from the first polarizer enters the waveguide through the light incident surface;
an LCOS panel disposed below the second surface and configured to convert the illumination beam into a polarized image beam; and a second polarizer disposed on the first surface and configured to allow the polarized image beam to pass through, wherein the polarized image beam from the LCOS panel passes through the second surface, the first surface, and the second polarizer in sequence.

10. The front-lit LCOS module according to claim 9, wherein the light-emitting elements include at least one first color light-emitting diode, at least one second color light-emitting diode, and at least one third light-emitting diode.

11. The front-lit LCOS module according to claim 10, wherein an area of the light-emitting surface of the first color light-emitting diode is greater than an area of the light-emitting surface of the second color light-emitting diode and greater than an area of the light-emitting surface of the third color light-emitting diode.

12. The front-lit LCOS module according to claim 10, wherein one of the first color light-emitting diode, the second color light-emitting diode, and the third color light-emitting diode is a red light-emitting diode, another one of the first color light-emitting diode, the second color light-emitting diode, and the third color light-emitting diode is a green light-emitting diode, and the other one of the first color light-emitting diode, the second color light-emitting diode, and the third color light-emitting diode is a blue light-emitting diode.

13. The front-lit LCOS module according to claim 9, wherein each of the light-emitting elements has a top electrode beside the light-emitting surface thereof, and the window plate exposes the top electrode.

14. The front-lit LCOS module according to claim 9, wherein a side surface of the window plate is coated with a reflective film.

15. The front-lit LCOS module according to claim 9, wherein the light-emitting elements are symmetrically disposed on the substrate with respect to a line of symmetry.

16. The front-lit LCOS module according to claim 9, wherein a side of each of the light-emitting elements is not parallel to a side of the substrate, and is not perpendicular to the side of the substrate.

17. The front-lit LCOS module according to claim 9, wherein a side of each of the light-emitting elements is parallel or perpendicular to a side of the substrate.

18. The front-lit LCOS module according to claim 9 further comprising a plurality of micro-mirrors disposed along the first surface and configured to reflect the illumination beam to the LCOS panel.

19. The front-lit LCOS module according to claim 9, wherein the light-emitting elements having different light colors are configured to emit lights with different colors in turn.

* * * * *